United States Patent [19]
Ridgers

[11] Patent Number: 4,789,837
[45] Date of Patent: Dec. 6, 1988

[54] SWITCHED CAPACITOR MIXER/MULTIPLIER

[75] Inventor: Timothy J. Ridgers, Alpharetta, Ga.

[73] Assignee: Sangamo Weston, Inc., Norcross, Ga.

[21] Appl. No.: 41,273

[22] Filed: Apr. 22, 1987

[51] Int. Cl.[4] .......................... H03K 3/02; H03C 1/00; G06G 7/16

[52] U.S. Cl. .................................... 328/142; 307/261; 307/490; 307/493; 328/160

[58] Field of Search ................ 328/142, 160; 307/490, 307/493, 261

[56] References Cited
U.S. PATENT DOCUMENTS 4,616,185 10/1986 van Roermund ................... 328/160

Primary Examiner—John Zazworsky
Attorney, Agent, or Firm—Sanford J. Asman

[57] ABSTRACT

A sequence of samples of a time varying signal is multiplied by respective, corresponding, multiplicands corresponding to values of a separate signal. The multiplicands are provided as ratios of capacitances switched into and out of a circuit between the input time varying voltage and an accumulating integrator. The arrangement is used to provide multiplication of a time varying signal by corresponding amplitudes of a sinusoid without requiring generation of a sinusoid. The arrangement is used for sampling, detecting signals utilizing a simulated local oscillator signal, and for generation of an arbitrary time varying function.

20 Claims, 1 Drawing Sheet

SWITCHED CAPACITOR MIXER/MULTIPLIER

TECHNICAL FIELD

This invention relates to circuits for multiplying one time varying signal by another, and more particularly to mixing circuits, to detecting circuits, and to function generating circuits such as sine wave generators, wherein analog multiplication is provided at predetermined time intervals for accumulating a sequence of products of corresponding values of the time varying signals.

BACKGROUND ART

Prior art circuits are available for converting an incoming time varying signal to DC levels or to an intermediate frequency. It is known to provide the desired conversion by multiplication of the amplitude values of the incoming signal.

A frequently used and well known circuit for this purpose is known as a transconductance multiplier, utilizing bipolar integrated circuits. However, matching difficulties and inherent nonlinearity problems make such circuits unsuitable for implementation using MOS devices. An alternate arrangement used in MOS circuitry is capable of multiplying an incoming signal by a square wave. In such an arrangement, the incoming signal is multiplied by a local oscillator signal, utilizing a switching arrangement for passing the incoming signal during one half of the period of the local oscillator. During the second half of the local oscillator period the switching arrangement passes the inverted form of the input signal.

The square wave by which the incoming signal is multiplied thus has a frequency determined by the frequency of the local oscillator. However, square waves, as well as signals multiplied thereby, are found to have many odd harmonic components. Thus, if an input signal has a frequency component at or near any of the odd harmonics, multiplication by the square wave results in translation of that component to a lower frequency, or to a DC level, which cannot be separated from a required signal which originally was near or at the square wave fundamental frequency. Accordingly, a difficulty with the prior art is a requirement of prefiltering the input signal to remove the above identified components. Such prefiltering frequently requires high-order filters.

Still a further technique known in the art utilizes a multiplying digital-to-analog converter (DAC). In such structures, an incoming signal is applied to a reference input of the converter and a digital conversion coefficient is changed at a rhythm which is some multiple of the desired local oscillator frequency. However, the coefficients thus used are portions of a binary sequence, rather than analog numbers. Thus, any multiplication by a DAC results in increased harmonic content and unwanted intermodulation products, which reduces the fidelity of the output signal as a representation of multiplication of the input signal by a sinusoid.

Digital filter circuits are known wherein capacitances are switched in and out of a circuit in order to change the filter characteristic thereof to eliminate a parasitic capacitance problem. However, when MOS switching devices are used in demodulators, the prior art typically utilizes the same merely for sampling a signal and for providing the sample for storage on a capacitor. Thus, it is known to charge and discharge holding capacitors utilizing MOS switching devices.

The prior art also teaches attenuation of a particular mark frequency applied to a demodulator by utilization of MOS devices to switch capacitances in to and out of the circuit.

However, the prior art does not teach or disclose an efficient manner or apparatus for multiplying time varying signals by analog coefficients, which represent sinusoidal coefficients, utilizing efficient switching techniques. The prior art more particularly is deficient in providing an arrangement for multiplying a sequence of samples of a first signal by a corresponding sequence of analog multiplicands representing hypothetical coefficients or samples of a second time varying signal in order to obtain a product signal, a heterodyne signal, or to generate an arbitrary time function, such as a sinusoidal signal.

DISCLOSURE OF INVENTION

It is accordingly an object of the present invention to overcome the difficulties of the prior art and to provide an arrangement wherein samples of a signal may be multiplied by a sequence of coefficients representing an arbitrary time varying signal.

It is a more specific object of the invention to provide a signal multiplying arrangement utilizing a plurality of switched capacitors to represent, by the capacitance ratios thereof, a sequence of predetermined multiplying coefficients for respective samples of the incoming signal.

It is another object of the invention to provide a system for generating a product signal, representing a sequence of products of samples of one signal by samples of another signal, by utilizing a plurality of MOS switched capacitors, having predetermined ratios to one another, and to convey a product voltage to an integrating amplifier and more specifically to provide the desired multiplication and to generate an output analog signal equal to the desired product signal by generating a sequence of control signals for switching the various capacitors in and out of the circuit.

In accordance with these and other objects of the invention, there is generally provided an apparatus which includes an input portion to input a first signal which is to be multiplied by a plurality of multiplicands corresponding to a sequence of amplitude values of a second signal. Additionally, a multiplier is provided for multiplying at predetermined times a sequence of values of the first signal by respective multiplicands corresponding to the sequence of values of the second signal. An adding portion of the apparatus sums the multiplied values of the first signal and provides an output corresponding to a sum of respective products of corresponding values of the first and second signal. Preferably, the multiplier includes a plurality of switched capacitors, particularly including plural capacitors of predetermined values and controlled switches connected to the capacitors for providing controllably variable interconnections thereof. The controlled switches thus provide to the adding portion, at predetermined times, controllable ratios of capacitors as a sequence of respective multipliers for the sequence of values of the first signal.

The adding portion preferably is formed of an operational amplifier with an input terminal which is switchably connected to the multiplying portion. In accordance with another aspect of the invention, a control circuit is provided for generating a number of control signals, the signals respectively controlling the several switches in order to provide the respective combinations of capacitances at the predetermined times.

The control circuit is preferably operable to provide the various combinations of capacitances in order to multiply the sequence of values of the first signal by ratios corresponding to sinusoidal values of the predetermined times when taken as a portion of a predetermined time interval equal to a period of the second signal. That is, the first signal is sampled at particular intervals and the multiplicands are provided as coefficients having values varying sinusoidally, with the timing of occurrence of the intervals being the argument of the sinusoid.

Still another feature of the invention is the multiplication of a sequence of samples of the first signal by a repeating sequence of coefficients, the coefficients being repeated at a frequency given by the sampling frequency for the first signal divided by the number of coefficients in the sequence.

In accordance with another form of the invention there is provided a signal sampling apparatus operating as above described for the multiplying apparatus and providing a product function of the sampled signal multiplied by a sequence of repeating coefficients and utilizing MOS switched capacitors to generate the coefficients.

In accordance with yet another form of the invention there is provided a signal mixing apparatus in which a received signal is mixed with a local signal having a predetermined frequency. The sequential values of the received signal are multiplied by respective multiplicands, corresponding to a sequence of values of a local signal, to provide a product signal.

In accordance with still another form of the invention, there is provided a function generator which, by inputting a DC (or slowly varying signal) for multiplication by a sequence of coefficients corresponding to the function to be synthesized as above described, provides the desired function. More specifically, there is provided means for inputting a DC signal and a multiplier for multiplying sequential samples of the DC signal by the predetermined multiplicands at predetermined times. An adder sums the multiplied values of the DC signal and provides an output signal which corresponds to a sequence of products of the DC signal and the predetermined multiplicands. The multiplier includes a number of switched capacitors and controlled switches connected thereto for providing variable interconnections of the capacitors between the input and the adder, thus providing controllable ratios of the capacitors as multipliers for the input DC signal.

Other objects, features and advantages of the present invention will become readily apparent to those skilled in the art from the following description wherein there is shown and described a preferred embodiment of the invention, simply by way of illustration and not of limitation of the best mode for carrying out the invention. The invention itself is set forth in the claims appended hereto. As will be realized upon examination of the specification, the present invention is capable of still other, different, embodiments and its several details are capable of modifications in various obvious aspects, all without departing from the invention which is recited in the claims. Accordingly, the drawings and the descriptions provided herein are to be regarded as illustrative in nature and not as restrictive of the invention.

BRIEF DESCRIPTION OF THE DRAWING

The accompanying drawings, incorporated in and forming a part of the specification, illustrate several aspects of the present invention and, together with the description, serve to explain the principals of the invention. In the drawings.

BEST MODE FOR CARRYING OUT THE INVENTION

Figure 1:
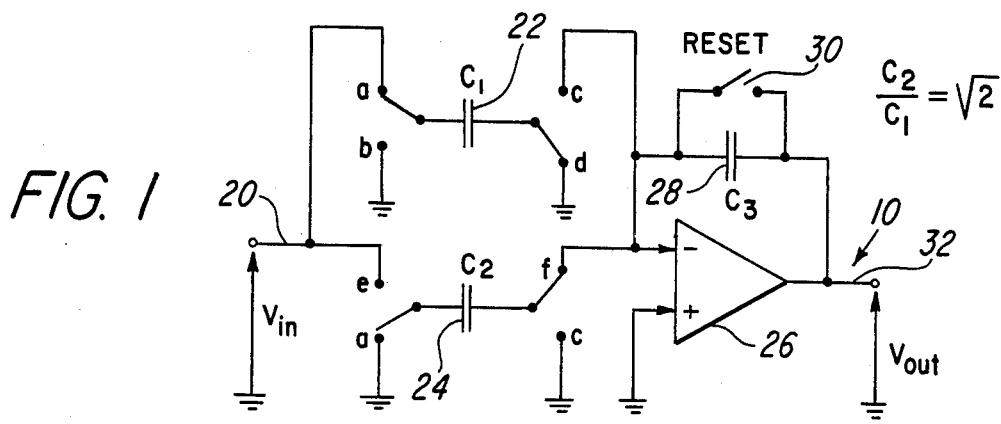
FIG. 1 illustrates the preferred embodiment of the invention.

Reference is now made to FIG. 1 of the accompanying drawings, wherein there is shown an illustration of a preferred embodiment of the invention in which one signal is provided as a time function input signal, which may be a constant signal, a slowly varying, or a rapidly varying signal, and wherein further a number of capacitances are selectively switched in and out of a circuit between the input and an integrator functioning as a summing circuit, to provide an output signal which represents a sinusoidal multiplier of the input signal. That is, the embodiment illustrated at FIG. 1 permits individual samples of the input signal, taken at particular sample times, to be multiplied by corresponding (i.e., respective) multiplicands which represent values of a sinusoidal waveform at corresponding sample times. Thus, without inputting a sinusoidal signal or any signals which vary sinusoidally or indeed have an amplitude value of the sinusoid, the input signal is multiplied by an arbitrary sinusoid, as explained below.

Figure 2:
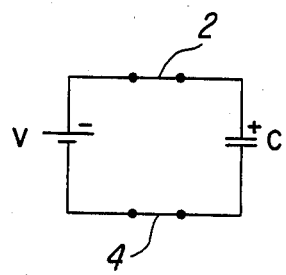
FIG. 2 shows one phase of operation of the invention.
Figure 3:
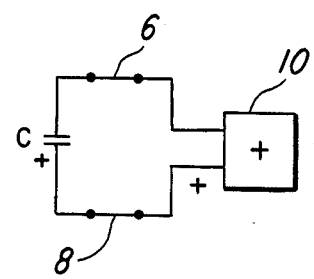
FIG. 3 shows a second phase of operation of the invention.
Figure 4:
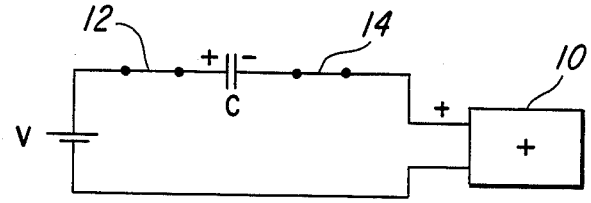
FIG. 4 shows yet a third phase of operation of the invention.

In order to understand operation of the embodiment illustrated in FIG. 1, it should be understood that operation of the circuit is essentially in accordance with the illustration shown at FIGS. 2, 3 and 4. In accordance with the invention, there is provided a capacitor C, shown at FIG. 2, which is connected by switches 2 and 4 across a voltage source and is charged thereby to the indicated polarity.

Inasmuch as charging is not instantaneous, due to internal impedances of the voltage source, for example, as well as because of the impedances of switches 2 and 4 used to connect the capacitor to the voltage source, a two-phase operation is used. Specifically, the charging operation is carried out during a first phase of operating the invention. In a second phase, illustrated in FIG. 3, capacitor C is connected by switches 6 and 8, with the inverted polarity illustrated in the figure, to an adder 10. In the present invention, it will be appreciated that adder 20 is formed of an integrator, utilizing an operational amplifier and a feedback capacitance, as described below.

In accordance with the invention, the two phases of operation illustrated in FIGS. 2 and 3 are repeated a number of times with the same or different capacitors. Accordingly, after adder 10 accumulates the charge stored on capacitor C during the phase illustrated by the arrangement of FIG. 3, switches 6 and 8 are opened and switches 2 and 4 are again closed in order once again to charge capacitor C. In continued repetitions of the sequence of operations, switches 2 and 4 are thereafter opened and switches 6 and 8 again closed for capacitor C to discharge the charge stored therein so that adder 10 may continue to accumulate a sequence of values corresponding to the charge on capacitor C.

An alternate form of operation is illustrated in FIG. 4, wherein the capacitor C is connected by switches 12 and 14 to adder 10. As will be appreciated upon comparison of FIGS. 3 and 4, the charge stored on capacitor C is applied to adder 10 in opposite directions for the arrangements of FIGS. 2 and 3 on the one hand and FIG. 4 on the other. Thus, in the arrangement shown at FIG. 4, both phases of the operation illustrated in FIGS. 2 and 3 are carried out in a single phase. Thus, in the arrangement of FIG. 4 the voltage source provides charge to capacitor 4, and simultaneously to adder 10. Thus, while a positive voltage in FIG. 2 provides a negative charge to adder 10 in the phase illustrated at FIG. 3, a positive voltage provides a positive charge to adder 10 in the arrangement of FIG. 4. Accordingly, phase inversion (or sign reversal) may be achieved by connecting a voltage source to the capacitor in the arrangements of FIGS. 2 and 4. It will also be appreciated that the voltage source illustrated at FIGS. 2 and 4 may be fixed or time varying.

The preceding discussion has indicated the possibility of providing to an output of a summer an accumulated sum of values representing a sequence of voltages presented by a voltage source at predetermined sample times. However, as will be appreciated from the following description, such an accumulation may be provided with multiplication of the sequence of input voltage values by arbitrary multiplicands. Accordingly, if a first voltage value is input during a first interval of operation, illustrated in FIG. 2, to a capacitor C, and if the voltage value is thereafter accumulated by adder 10 in a phase of operation illustrated at FIG. 3, an amount of charge Q, given by $$Q = CV$$

is accumulated by the adder. If, during the next sampling and accumulating phase of operation, the same voltage value provided by the same input source is connected to charge a capacitor having twice the capacitance of capacitor C, i.e., 2C, then twice the charge is stored on the feedback capacitor of the adder, thus providing twice the voltage increment provided during the first operating interval. Accordingly, by changing the capacitance used to charge and discharge during the phases illustrated in FIGS. 2 and 3, the amount of charge delivered to the adder is controllable and thus the voltage developed at the output of the adder is similarly controllable. Similar comments are applicable to the arrangement of FIG. 4, wherein the polarity of charge stored by the adder is reversed but wherein the above described concepts are equally applicable. In other words, changing of the capacitance value being charged by a voltage source is used to change the voltage level accumulated by an adder, notwithstanding the fact that the actual charging voltage remains fixed.

Accordingly, the present invention provides for a plurality of capacitors, and a plurality of switches, for selectively connecting various ones of the capacitors to the input voltage source and for discharging the same to an accumulating adding device in order to provide effective multiplication of the various samples of the input voltage by multiplicands which are proportional to the capacitance utilized during the sampling and discharging intervals.

Referring now to FIG. 1, there is shown an arrangement wherein an input voltage signal is applied to an input terminal 20. A plurality of capacitors, illustrated by capacitors 22 and 24, are available to be charged by the input voltage. Each of the capacitors is associated with a number of switches which, when operated, may connect the same to the voltage source and/or to the adder, as illustrated at FIGS. 2, 3 and 4. Eight switches are shown in FIG. 1 for connecting the capacitors to the voltage source and to the adder. The switches are symbolically illustrated as four single pole double throw switches.

However, in accordance with the invention, each "pole" of the switches is, in fact, realized by a switched MOS transistor. Eight switched transistors are thus utilized in the embodiment shown in FIG. 1.

As shown in the figure, the accumulating adder 10 is represented by an operational amplifier 26 as well as a feedback capacitor 28. A reset switch 30 is provided for initiating operation by discharging capacitor 28.

It should be appreciated that while the use of switched capacitors in digital filters is known, more particularly in order to vary the filtering coefficients and characteristics, reset switch 30 utilized in the embodiment of FIG. 1 effectively clears the memory of the filter, restarting operation at predetermined intervals in order to accumulate sums from some initial time period, wherein the sums represent sums of products of multiplications of individual samples of the input signal by corresponding multiplicands.

It is to be further noted that in FIG. 1 the eight switches associated with the two multiplying capacitors 22 and 24 are referenced by a total of only six different reference letters, A, B, C, D, E and F. The implication is merely that the same control signal may be used to control several MOS switches having the same reference literal. It is particularly seen that the same signal is used to control one of the input poles of both capacitors 22 and 24, illustrated by "A". Similarly, a single signal is used to control one of the output switches of each of capacitors 22 and 24, and is identified by the reference literal "C".

Figure 5:
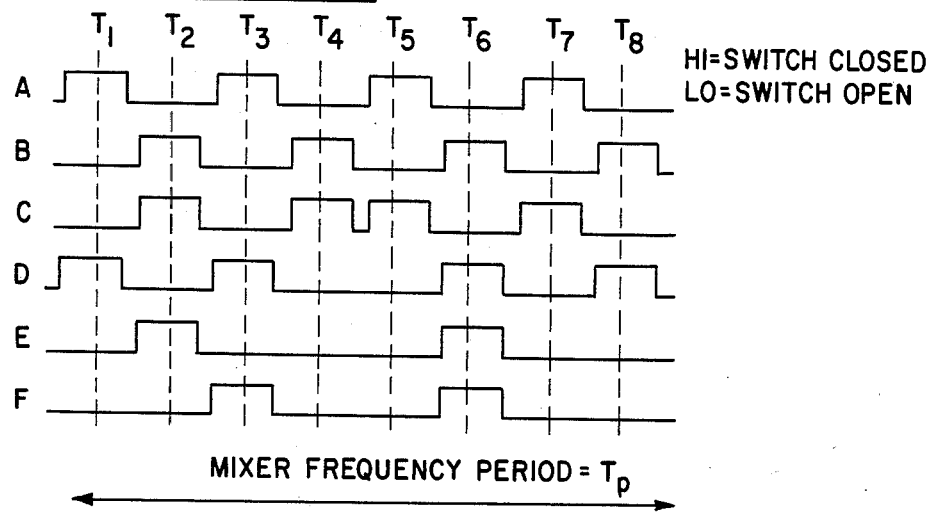
FIG. 5 shows control signals applied to the MOS switches of the embodiment of FIG. 1 to multiply a sequence of values of an input signal by corresponding amplitudes of a sinusoidal signal.

Referring now to FIG. 5, six switching waveforms are shown, provided by a control circuit (not illustrated) to the eight individual MOS controlled switches used to switch capacitors 22 and 24 in and out of connection with the input terminal 20 and/or the inverting input terminal to operational amplifier 26. The non-inverting terminal of amplifier 26 is connected to ground, and the input signal is provided between terminal 20 and ground while the output signal is provided between an output terminal 32 and ground.

The signals provided to the two input switched transistors labelled "A" are shown in the waveform labelled A in FIG. 5. The waveform labelled B illustrates the switching signal provided to the second input switched transistor B for capacitor 22. The waveform shown as C in FIG. 5 is applied to each of the two output switched transistors labelled "C" for capacitors 22 and 24. Waveform "D" in FIG. 5 is provided to the output switch transistor referenced "D" for capacitor 22, while the switching waveform shown at "E" in FIG. 5 is provided to the input switched transistor referenced by E for capacitor 24. Finally, the waveform shown at "F" in FIG. 5 is provided to the switched transistor represented by pole "F" for the capacitor 24.

The interpretation of the waveforms illustrated at FIG. 5 is that a high level represents a voltage level closing a particular switch while a low level represents a voltage level opening the switch. In accordance with the invention, each interval of the signals is preceded by a short interval in which a low voltage is present. Thus, all switches are placed in a brief opened state prior to each interval wherein one or more switches are closed. Thus, the high voltage levels of the waveforms are shorter than the low voltage levels, as illustrated at FIG. 5. The various time intervals representing the phases of operation of the invention are identified by references T1, T2, ... T8.

The above described opening of all switches prior to closure of a switch during an interval is illustrated by the negative going "notch" between time intervals T4 and T5 in the waveform labelled C. As will be understood from the following description, at both intervals T4 and T5 the switch C is to be closed. However, between the two intervals the switch is opened during a predefined time period therefor.

As will be appreciated from the drawings, operation during the time interval referenced by T2 provides a connection of capacitor 24 between the input terminal 20 and ground via closure of switches E and C, for charging capacitor 24 during this interval. Simultaneously, capacitor 22 is connected between the inverting input terminal of operational amplifier 26 and ground via closure of switches B and C.

Accordingly, during interval T2 capacitor 22 is connected by the controlled switches to discharge a previously stored charge thereon to the accumulating adder 10, in the manner illustrated at FIG. 3. During the same interval, however, capacitor 24 is connected by the switched arrangement to be charged by the input voltage, in the manner shown at FIG. 2.

During the interval T3, illustrated by the switch connections of FIG. 1, the connection of the capacitors differs. In the time interval T3 the input voltage signal on terminal 20 is sampled by capacitor 22, in response to closure of switched transistors represented by A and D in the figure. At the same time, the capacitor 24 is discharged, and the charge stored thereon accumulated by the accumulating adder 10, due to closure of switched MOS transistors represented by A and F.

As is known by those skilled in the art, an integrating amplifier having an input capacitance as illustrated in the arrangement of FIG. 1 will provide a gain for the input signal which is determined by the ratio of the input capacitance to the feedback capacitance. Accordingly, when capacitor 22 is connected to input the signal to the operational amplifier, the output voltage generated by the amplifier upon full discharge of the capacitor charge is represented by the ratio C22/C30, that is, the ratio of the input to feedback capacitances. However, if the same input voltage were sampled by capacitor 24 and thereafter discharged to the integrating operational amplifier, the voltage increment at output terminal 32 would be determined by the ratio C24/C30. Thus, by switching between and/or among a number of different capacitors, it is possible to alter the output signal provided in response to a particular input signal. By choosing a ratio of capacitances for capacitor 24 to capacitor 22 to equal 1.414, the square root of 2, it is possible to provide a multiplication of samples of an input signal by values corresponding to amplitudes of a sinusoid at the sampling times. Indeed, the switching waveforms illustrated at FIG. 5, when applied to the arrangement of FIG. 1 wherein the above described ratio is chosen for capacitors 24 and 22, results in multiplication by the amplitudes of the above described sinusoid during a time period represented by the eight intervals T1, T2, ... T8. Thus, it will be appreciated upon analysis of the resulting connections of the input voltage signal from terminal 20 through one or the other of capacitors 22 and 24, and from the subsequent discharge of the appropriate capacitor to operational amplifier 26 and feedback capacitor 30 thereof, that a period of the multiplicand sinusoid, or any other function, may be arbitrarily selected by determining the number of coefficients used in a repeating sequence.

In the illustrative example of FIG. 2, eight amplitude values are selected, to represent the amplitude of a sinusoid for each 45° interval thereof. It should be understood, however, that although the intervals are illustratively selected to be regularly distributed during the period of the multiplying time function, i.e, each 45° of the sinusoid, a multiplying waveform may be represented by coefficients which are irregularly spaced during the period of the waveform. For example, where an input signal is rapidly changing during a first portion and is thereafter relatively steady, there may be more sampling intervals and more multiplicands defined for the initial period and fewer samples and multiplicands provided for the later portion of the input signal.

In the arrangement of FIGS. 1 and 5, during the first four intervals the arrangements are provided in accordance with FIGS. 2 and 3 in order to provide one polarity of multiplicand, corresponding respectively to 0, 0.7, 1.0 and 0.7. During the last four of the eight intervals, the switching signals are provided to result in an arrangement similar to that illustrated at FIG. 4, which is used to provide negative coefficients, including 0, −0.7, −1.0 and −0.7. Thereafter, the waveforms controlling the switching transistors repeat and operation of the inventive circuit similarly repeats.

The number of coefficients selected to represent the sinusoid is, in the illustrative example, eight. However, it should be understood that any number of coefficients may be selected. The cyclic frequency of the multiplying sequence is determined by the sample frequency divided by the number of coefficients in the repeating sequence. As further apparent from the preceding description, selection of a different number of coefficients forming the cyclic sequence, or different phase placement of the samples during the sampling period, may result in requirements for different multiplicands, which may be more easily fabricated utilizing layout of capacitors on integrated circuit chips. Thus, while utilization of capacitors related to each other by a ratio equal to the square root of 2 is attractive, such a ratio may not be as easily implemented as integer ratios such as 2 or 3, for example. Accordingly, multiplicands representing samplings at 30° or 60° phase increments; of a sinusoid may be preferable to those representing 45° phases during the sampling period.

At any rate, in accordance with the invention, the amplitude of the sinusoid, represented by the ratio of one capacitor to another, corresponds to the sinusoidal value of the timing of the specific sample during the entire sample period. Thus, where sample T2, for example, occurs ⅛ of a sampling period after the initial sample, the amplitude required to be represented by the multiplicand for that sample is given by the value of a sinusoid at ⅛ of the entire 360° sampling period, or at 45°. Similarly, at T3, 2/8 or ¼ of the 360° sampling period have passed since the initial sample at T1. Accordingly, the amplitude of the multiplicand for the period T3 is selected to represent the amplitude of a sinusoid at ¼ of its 360° period, i.e., at 90°.

Of course, the previously mentioned phase difference between operation in accordance with FIGS. 2 and 3 on the one hand and FIG. 4 on the other must be taken into account in determining the particular switching signals to be provided during each of the sampling intervals. Similarly, the phase inversion provided by the operational amplifier itself is taken into account to determine the polarity of the output signal.

The above arrangement can thus be used in modulating or demodulating signals, as well as in generating sinusoidal signals or other functions from input DC signals. More particularly, if the input signal provided to input terminal 20 is at a fixed level, and the various samples thereof are multiplied by corresponding amplitudes of a sinusoid, the resultant output signal will be a sinusoid. Similarly, any function may be represented by a sequence of switching signals used to control the various MOS switches of the embodiment of FIG. 1. By generating the set of clock signals illustrated in FIG. 5, it is thus within the scope of the invention to generate an arbitrary output waveform, in the manner of a function generator. Other applications of the inventive concept relate to mixing of input signals by multiplication by a locally generated frequency. However, in view of the advantages of the present invention, it is not necessary to have a local oscillator which generates a sinusoidal signal. It is similarly not necessary to obtain particular samples of a sinusoid. Instead, it is merely necessary to provide appropriate capacitor values and appropriate clock signal waveforms in order to simulate the presence of a local oscillator. By mixing the incoming signal with a local oscillator frequency, it is thus possible to utilize the present invention for frequency translation or for detection of signals of particular frequencies. Similarly, incoming signals may be downconverted from a particular frequency to a DC signal in homodyne detection or from an incoming frequency to an intermediate frequency in a heterodyne detection operation. In any of the above, the effective frequency of the simulated local oscillator is determined by the sampling frequency divided by the number of coefficients in the repeating sequence of coefficients. Operation of the inventive system is simpler than one utilizing digital to analog conversion inasmuch as ratios of capacitances are used, representing analog numbers rather than a binary sequence as representations of sine wave amplitudes. Of course, as with any sampling arrangement, typical constraints on sampling rates are taken into consideration to avoid aliasing and other known problems.

Moreover, a combination of multipliers in accordance with the present invention may be utilized to convert a sinusoidal signal to a DC level representing the amplitude of the signal. Such structures typically utilize two multipliers, one receiving a sine signal and the other receiving a cosine signal. The multipliers may be fabricated in accordance with the present invention and, instead of providing a sine wave and a cosine wave from local oscillators, different sets of clock signals may be utilized.

Moreover, prefiltering constraints of a simple switching, square wave multiplier, may be reduced with the aid of the inventive concept. For example, by sampling the input signal at a rate which is eight times the desired local oscillator frequency, utilizing a circuit as illustrated in FIG. 1 wherein eight switches are utilized, it is possible to eliminate spurious harmonics below the seventh harmonic.

Advantageously, the present circuit is drawn in a parasitic-insensitive manner, wherein switches are provided in a differential manner. Specifically, each of the capacitors is arranged by the switched elements to have one end switched between the input signal and ground and to have the other end switched between the input terminal of the operational amplifier and ground. The sampling period, or mixing frequency period $T_p$, is shown on the drawing of FIG. 5 as encompassing all switching actions. The time period is divided into a number, illustratively shown as 8, of elementary intervals during which the various operations involved with sampling and coefficient multiplication occur. During an in-phase operation with sine inversion, accumulation of the signals in the feedback capacitor 30 used with operational amplifier 26 occur during the same interval as the sampling operation. Accumulation occurs with a delay of one time interval from sampling in operations providing an out of phase sequence, illustrated in FIG. 2 and 3, together with a normal output polarity. The sequence of clock signals illustrated in FIG. 5 provide no signal transfer when the multiplicand is 0.

As has been described hereinabove, the ratio between the input capacitors is used to provide the relative weighting of some samples over others. The feedback capacitor 30 is used to control the overall transfer gain. For an eight-part period illustrated in operation of the circuit of FIG. 1 by the switching waveforms of FIG. 5, the optimum ratio of the capacitor was found to be the square root of 2. The sequence of multiplicands, as has been hereinabove described, represents coefficients of 0, 0.7, 1.0, 0.7, 0, −0.7, −1.0 and −0.7, to within an arbitrary gain constant. Use of a ratio defined by the square root of 2 minimizes intermediate modulation and harmonic distortion as may be verified by performing a Fourier analysis. These coefficients correspond to the sine value of an angle represented by 1/Nth intervals of the mixing frequency period, represented by 0, 45°, 90°, 135°, 180°, 225°, 270° and 315°.

Although an integrator is utilized in the illustrative embodiment of FIG. 1, it is recognized that the function performed by the integrator is to accumulate the components over a relatively long period of time, to perform a desired down-conversion operation. However, alternate integrator structures may be used. For example, a "perfect" integrator (whether or not used with a reset switch) may be replaced by a "leaky" integrator, i.e., a low pass filter. Such an arrangement may be used for performing post detection filtering, removal of sum-of-frequency components, and limiting detection band width about a local oscillator frequency.

As hereinabove explained, signal component transfer to the integrator includes a variable delay, determined by the polarity of the multiplying coefficient. Such delay variation may translate to a phase jitter at an intermediate frequency, however. Accordingly, if the inventive arrangement is to be used in a heterodyne detector, it is necessary to utilize an intermediate frequency which is much lower than the incoming and mixing frequencies. Frequencies which are an order of magnitude lower are preferred.

As is apparent from the foregoing description, the inventive arrangement may be used in a number of applications. Broadly, the invention relates to a multiplying arrangement wherein a sequence of values of an input signal, obtained at predetermined times, is multiplied by a corresponding sequence of respective multiplicands, and wherein the products are summed. The inventive structure is similarly applicable as a function generator, and more specifically a sinusoidal signal generator, when the input signal is a DC or slowly varying signal. Similarly, the invention is useful in signal mixing applications and signal sampling applications.

It should be appreciated that although two capacitors are shown in the arrangement of FIG. 1, any number of such capacitors may be used. A corresponding change is provided in the number of coefficients used in the mixer-frequency period $T_p$.

Where multiplication is by a sinusoid, the optimum coefficients in accordance with the above criteria for minimized intermodulation distortion or harmonic distortion are found to be determined by the amplitude values of the sine wave at equal phase intervals, obtained by the number of capacitors. Such a solution presumes that sampling periods are uniformly distributed over the mixer frequency period. Although the logic circuitry used to generate the clock signals is not shown herein, once the clock signal waveforms are determined in accordance with the invention, any switching control circuit may be utilized or specifically designed to generate such signals, utilizing techniques well known in the art. For sine/cosine detection, wherein the input signal is phase modulated, or at an unknown phase, the same logic circuitry used to generate the clock signals may be used with one set of capacitors, switches and operational amplifier to provide the sine multiplier and, as above described, with a delay of ¼ of the mixer/frequency period, to provide the cosine multiplier.

To use the circuit of FIG. 1 as a sine wave generator, the switching signals provided for switches A and C for capacitor 22 should be swapped with one another, as should the signals provided for MOS switch transistors B and D. Similarly changeovers should be provided between the signals provided to the switches represented by E and F for capacitor 24, as well as for the signals provided for the switched transistors A and C thereof.

The foregoing description of the preferred embodiment of the invention has been presented for purposes of illustration and description and is not intended to be exhaustive or to limit the invention to the precise forms disclosed, since many obvious modifications and variations are possible in the light of the above teaching. The embodiment was chosen and described in order best to explain the principles of the invention and its practical application, thereby to enable others skilled in the art best to utilize the invention in various embodiments and with various modifications as are suited to the particular use contemplated. It is intended that the scope of the invention be defined by the claims appended hereto, when interpreted in accordance with the full breadth to which they are fairly and legally entitled.

I claim:

1. Signal sampling apparatus comprising:
    input means for providing an input signal to be sampled;
    multiplying means for multiplying sequential values of the input signal by predetermined respective multiplicands at predetermined sample times; and
    summing means for summing the multiplied values of the signal; and for providing an output signal corresponding to a sum of respective products of the input signal values and the respective multiplicands wherein
    said multiplying means comprises a plurality of switched capacitor means, including plural capacitors having predetermined capacitance values and controlled switch means connected to said plural capacitors for providing controllably variable interconnections of capacitors between said input means and said summing means,
    said controlled switch means comprising, for each of said capacitors, an input and an output switch respectively connected to an input terminal and an output terminal of each said capacitor and connected to be controlled by different control signals for providing two-phase operation thereof,
    wherein in a first phase an input switch of a predetermined capacitor connects said capacitor to said input means for receiving said input signal and an output switch of said predetermined capacitor connects said predetermined capacitor to complete a loop with said input means,
    and in a second phase said output switch of said predetermined capacitor connects said predetermined capacitor to said summing means and said input switch of said predetermined capacitor connects said predetermined capacitor to complete a loop with said summing means,
    thereby providing controllable ratios of said plural capacitors as multipliers for said input signal provided at said predetermined sample times to said summing means.

2. Signal sampling apparatus as recited in claim 1 wherein said summing means comprises operational amplifier means having an input terminal switchably connected to said multiplying means.

3. Signal sampling apparatus as recited in claim 2 further comprising control means for generating a plurality of said different control signals for respectively controlling said controlled switch means, thereby to provide at said predetermined sample times respective predetermined combinations of capacitances between said input means and said input terminal of said operational amplifier means for multiplying said sequential values of said input signal by respective capacitance ratios.

4. Signal sampling apparatus as recited in claim 3 wherein said control means is operable for providing said respective combinations of capacitances to multiply said sequential values of said input signal by respective multiplicands corresponding to sinusoidal values of said predetermined sample times within a predetermined time interval.

5. Apparatus as recited in claim 1, wherein said input and output switches each comprises a single-pole-double-throw switch.

6. Signal mixing apparatus comprising:
    input means for inputting a received signal to be mixed with a local signal having a predetermined frequency;
    multiplying means for multiplying at predetermined times sequential values of the received signal by predetermined respective multiplicands corresponding to a sequence of values of the local signal; and summing means for summing the multiplied values of the signal and for providing an output signal corresponding to a sum of respective products of the values of the received signal and the respective values of the local signal, wherein said multiplying means comprises a plurality of switched capacitor means, including plural capacitors having predetermined capacitance values and controlled switch means connected to said plural capacitors for providing controllably variable interconnections of capacitors between said input means and said summing means, said controlled switch means comprising, for each of said capacitors, an input and an output switch respectively connected to an input terminal and an output terminal of each said capacitor and connected to be controlled by different control signals for providing two-phase operation thereof, wherein in a first phase an input switch of a predetermined capacitor connects said capacitor to said input means for receiving said received signal and an output switch of said predetermined capacitor connects said predetermined capacitor to complete a loop with said input means, and in a second phase said output switch of said predetermined capacitor connects said predetermined capacitor to said summing means and said input switch of said predetermined capacitor connects said predetermined capacitor to complete a loop with said summing means, thereby providing controllable ratios of said plural capacitors as multipliers for said sequential values of the received signal provided at said predetermined times to said summing means.

7. Signal mixing apparatus as recited in claim 6 wherein said summing means comprises operational amplifier means having an input terminal switchably connected to said multiplying means.

8. Signal mixing apparatus as recited in claim 7 further comprising control means for generating a plurality of said different control signals for respectively controlling said controlled switch means, thereby to provide at said predetermined times respective predetermined combinations of capacitances between said input means and said input terminal of said operational amplifier means for multiplying said sequential values of the received signal by respective predetermined capacitance ratios.

9. Signal mixing apparatus as recited in claim 8 wherein said control means is operable for providing said respective combinations of capacitances to multiply said sequential values of the received signal by respective multiplicands corresponding to sinusoidal values of said predetermined times within a time interval equal to a period of said predetermined frequency of said local signal.

10. Apparatus as recited in claim 6, wherein said input and output switches each comprises a single-pole-double-throw switch.

11. Function generator apparatus comprising:
input means for providing an input DC signal;
multiplying means for multiplying sequential samples of the input DC signal by predetermined multiplicands at predetermined times; and
summing means for summing the multiplied values of the DC signal and for providing an output signal corresponding to a sequence of products of said DC signal and said predetermined multiplicands; wherein said multiplying means comprises a plurality of switched capacitor means, including plural capacitors having predetermined capacitance values and controlled switch means connected to said plural capacitors for providing controllably variable interconnections of capacitors between said input means and said summing means, said controlled switch means comprising, for each of said capacitors, an input and an output switch respectively connected to an input terminal and an output terminal of each said capacitor and connected to be controlled by different control signals for providing two-phase operation thereof, wherein in a first phase an input switch of a predetermined capacitor connects said capacitor to said input means for receiving said input DC signal and an output switch of said predetermined capacitor connects said predetermined capacitor to complete a loop with said input means, and in a second phase said output switch of said predetermined capacitor connects said predetermined capacitor to said summing means and said input switch of said predetermined capacitor connects said predetermined capacitor to complete a loop with said summing means, thereby providing controllable ratios of said plural capacitors as multipliers for said input DC signal provided at said predetermined times to said summing means.

12. Function generator apparatus as recited in claim 11 wherein said summing means comprises operational amplifier means having an input terminal switchably connected to said multiplying means.

13. Function generator apparatus as recited in claim 12 further comprising control means for generating a plurality of said different control signals for respectively controlling said controlled switch means, thereby to provide at said predetermined times respective predetermined combinations of capacitances between said input means and said input terminal of said operational amplifier means for multiplying said input DC signal by predetermined capacitance ratios.

14. Function generator apparatus as recited in claim 13 wherein said control means is operable for providing said predetermined combinations of capacitances to multiply said input DC signal by multiplicands corresponding to sinusoidal values of said predetermined times within a predetermined time interval equal to a period of the sinusoidal signal being generated.

15. Apparatus as recited in claim 11, wherein said input and output switches each comprises a single-pole-double-throw switch.

16. Signal multiplying apparatus comprising:
input means for inputting a first signal to be multiplied by a plurality of multiplicands corresponding to amplitude values of a second signal;
multiplying means for multiplying at predetermined times a sequence of values of the first signal by a sequence of respective multiplicands corresponding to said values of said second signal; and
summing means for summing the multiplied values of the first signal and for providing an output corresponding to a sum of respective products of corresponding values of said first and second signals; wherein said multiplying means comprises a plurality of switched capacitor means, including plural capacitors having predetermined capacitance values and controlled switch means connected to said plural capacitors for providing controllably variable interconnections of capacitors between said input means and said summing means, said controlled switch means comprising, for each of said capacitors, an input and an output switch respectively connected to an input terminal and an output terminal of each said capacitor and connected to be controlled by different control signals for providing two-phase operation thereof, wherein in a first phase an input switch of a predetermined capacitor connects said capacitor to said input means for receiving said first signal and an output switch of said predetermined capacitor connects said predetermined capacitor to complete a loop with said input means, and in a second phase said output switch of said predetermined capacitor connects said predetermined capacitor to said summing means and said input switch of said predetermined capacitor connects said predetermined capacitor to complete a loop with said summing means, thereby providing to said summing means at said predetermined times controllable ratios of said plural capacitors as said sequence of respective multiplicands for said sequence of values of said first signal provided.

17. Signal multiplying apparatus as recited in claim 16 wherein said summing means comprises operational amplifier means having an input terminal switchably connected to said multiplying means.

18. Signal multiplying apparatus as recited in claim 17 further comprising control means for generating a plurality of said different control signals for respectively controlling said controlled switch means, thereby to provide at said predetermined times respective predetermined combinations of capacitances between said input means and said input terminal of said operational amplifier means for multiplying at said predetermined times said sequential values of said first signal by respective predetermined capacitance ratios forming said respective multiplicands.

19. Signal multiplying apparatus as recited in claim 18 wherein said control means is operable for providing said respective predetermined combinations of capacitances to multiply said sequence of values of said first signal by ratios corresponding to sinusoidal values of said predetermined times within a predetermined time interval equal to a period of said second signal.

20. Apparatus as recited in claim 16, wherein said input and output switches each comprises a single-pole-double-throw switch.

* * * * *